(12) United States Patent
Zeghuzi et al.

(10) Patent No.: US 11,677,214 B2
(45) Date of Patent: Jun. 13, 2023

(54) DIODE LASER HAVING REDUCED BEAM DIVERGENCE

(71) Applicant: Ferdinand-Braun-Institut gGmbH Leibniz-Institut für Höchstfrequenztechnik, Berlin (DE)

(72) Inventors: Anissa Zeghuzi, Berlin (DE); Jan-Philipp Koester, Berlin (DE); Hans Wenzel, Berlin (DE); Heike Christopher, Berlin (DE); Andrea Knigge, Königs Wusterhausen (DE)

(73) Assignee: FERDINAND-BRAUN-INSTITUT GGMBH, LEIBNIZ-INSTITUT FÜR HÖCHSTFREQUENZTECHNIK, Berlin (DE)

( * ) Notice: Subject to any disclaimer, the term of this patent is extended or adjusted under 35 U.S.C. 154(b) by 15 days.

(21) Appl. No.: 17/218,926

(22) Filed: Mar. 31, 2021

(65) Prior Publication Data
US 2021/0305772 A1 Sep. 30, 2021

(30) Foreign Application Priority Data
Mar. 31, 2020 (DE) ...................... 10 2020 108 941.4

(51) Int. Cl.
*H01S 5/065* (2006.01)
*H01S 5/042* (2006.01)
(Continued)

(52) U.S. Cl.
CPC .......... *H01S 5/0421* (2013.01); *H01S 5/0653* (2013.01); *H01S 5/222* (2013.01); *H01S 5/4062* (2013.01); *H01S 2301/18* (2013.01)

(58) Field of Classification Search
None
See application file for complete search history.

(56) References Cited

U.S. PATENT DOCUMENTS 4,282,494 A * 8/1981 Yonezu ............... H01S 5/16
372/43.01
4,445,218 A * 4/1984 Coldren ............ H01S 5/04254
372/44.01
(Continued)

FOREIGN PATENT DOCUMENTS

CN 111082314 A * 4/2020 ............. H01S 5/068
DE 102010040767 1/2014
(Continued)

OTHER PUBLICATIONS

P. D. V. Eijk, et al., "Analysis of the modal behavior of an antiguide diode laser array with Talbot filter", J. Light. Technol., vol. 9, No. 5, pp. 629-634, 1991.
(Continued)

*Primary Examiner* — Tod T Van Roy
(74) *Attorney, Agent, or Firm* — Ray Quinney & Nebeker P.C.; Paul N. Taylor

(57) ABSTRACT

The present disclosure relates to a diode laser having reduced beam divergence. Some implementations reduce a beam divergence in the far field by means of a deliberate modulation of the real refractive index of the diode laser. An area of the diode laser (e.g., the injection zone), may be structured with different materials having different refractive indices. In some implementations, the modulation of the refractive index makes it possible to excite a supermode, the field of which has the same phase (in-phase mode) under the contacts. Light, which propagates under the areas of a lower refractive index, obtains a phase shift of π after passing through the index-guiding trenches. Consequently, the in-phase mode is supported and the formation of the out-of-phase mode is prevented. Consequently, the laser field can, in this way, be stabilized even at high powers such that only a central beam lobe remains in the far field.

20 Claims, 5 Drawing Sheets

(51) Int. Cl.
*H01S 5/22* (2006.01)
*H01S 5/40* (2006.01)

(56) References Cited

U.S. PATENT DOCUMENTS

| | | | | |
|---|---|---|---|---|
| 4,694,459 A | * | 9/1987 | Burnham | H01S 5/4068 372/50.1 |
| 4,811,354 A | | 3/1989 | Uomi et al. | |
| 4,985,897 A | * | 1/1991 | Botez | H01S 5/4062 372/18 |
| 5,272,711 A | * | 12/1993 | Mawst | B82Y 20/00 372/45.01 |
| 5,442,650 A | * | 8/1995 | Macomber | H01S 5/4062 372/50.1 |
| 6,256,330 B1 | * | 7/2001 | LaComb | H01S 5/20 372/45.01 |
| 7,457,340 B2 | * | 11/2008 | Botez | B82Y 20/00 372/50.12 |
| 8,831,061 B2 | * | 9/2014 | Lauer | H01S 5/1237 372/45.01 |
| 2006/0007976 A1 | * | 1/2006 | Watanabe | H01S 5/04254 372/45.01 |
| 2009/0268761 A1 | * | 10/2009 | Rice | H01S 5/04254 372/18 |
| 2010/0284434 A1 | * | 11/2010 | Koenig | H01S 5/04254 372/46.01 |
| 2010/0327300 A1 | * | 12/2010 | Epler | H01L 33/405 257/E33.064 |
| 2011/0243169 A1 | * | 10/2011 | Lauer | H01S 5/1017 372/45.01 |
| 2013/0343415 A1 | * | 12/2013 | Hori | H01S 5/02461 372/38.05 |
| 2020/0091681 A1 | * | 3/2020 | Gerhard | H01S 5/0282 |
| 2020/0161836 A1 | * | 5/2020 | Gerhard | H01S 5/32341 |
| 2020/0321749 A1 | * | 10/2020 | Gerhard | H01S 5/1017 |
| 2021/0305772 A1 | * | 9/2021 | Zeghuzi | H01S 5/1228 |

FOREIGN PATENT DOCUMENTS

| | | |
|---|---|---|
| DE | 102016113071 | 1/2018 |
| DE | 102017113389 | 12/2018 |
| SE | 502139 C2 * | 8/1995 |

OTHER PUBLICATIONS

H. Yang, et al., "10 W near-diffraction-limited peak pulsed power from Al-free phase-locked antiguided arrays", Electron. Lett., vol. 33, No. 2, pp. 136-137, 1997.

K. Staliunas, et al., "Subdiffraction and spatial filtering due to periodic spatial modulation of the gain-loss profile", Phys. Rev. A, vol. 80, No. 1, p. 013821, 2009.

M. Radziunas, et al., "Intrinsic Beam Shaping Mechanism in Spatially Modulated Broad Area Semiconductor Amplifiers", Appl. Phys. Lett., vol. 103, No. 13, p. 132101, 2013.

D. Botez, "High-power monolithic phase-locked arrays of antiguided semiconductor diode lasers", IEE Proceedings-J, vol. 139, No. I , pp. 14-23, 1992.

C Zhou, et al., "Simple Principles of the Talbot Effect", Optics & Photonics News, pp. 46-50, 2004.

Radziunas, et al.; "Intrinsic beam shaping mechanism in spatially modulated broad area semiconductor amplifiers"; Appl. Phys. Lett. 103, 132101 (2013), Published online Sep. 23, 2013; 5 pages.

Extended European Search Report for EP Serial No. 21166314.1, dated Aug. 12, 2021.

* cited by examiner

DIODE LASER HAVING REDUCED BEAM DIVERGENCE

The present invention relates to a diode laser having reduced beam divergence. In particular, the present invention relates to a diode laser having reduced beam divergence by means of a modulation of the real refractive index of the diode laser.

PRIOR ART

Since the invention of diode lasers, various concepts have been proposed in order to combine the high output power of broad-stripe lasers with the good beam quality of ridge waveguide lasers. The basic idea of all of these approaches is suppressing unwanted lateral laser modes.

Stripe-geometry lasers constitute one approach to achieving this. They are characterized by a periodic modulation of the contact and refractive index in one direction. Depending on whether the intensity maxima match the index maxima or index minima, the supermodes of such a system can be divided into "evanescent-wave type" (index guiding—see the lateral profile of the field amplitude in FIGS. 3(b) and (c)) or "leaky-wave type" (anti-index guiding—see the lateral profile of the field amplitude in FIGS. 3(d) and (e)). If the phase of all of the amplitude peaks matches, this is referred to as in-phase operation (see FIGS. 3(b) and 3(d)). The resulting far field has a diffraction-limited beam lobe as well as side peaks at far-field angles of $\pm\varphi_0 = \lambda_0/\Lambda_x$ (see FIG. 3(f)), wherein $\lambda_0$ is the vacuum wavelength and $\Lambda_x$ is the full period of the lateral index modulation. If the amplitude peaks have a $\pi$ phase shift with respect to one another, this is referred to as out-of-phase operation (see FIGS. 3(c) and 3(e)). The corresponding far field shows a high divergence and has two distinct intensity peaks at $\pm\varphi \approx \lambda_0/2\Lambda_x$ (see FIG. 3(g)), wherein $\lambda_0$ is the vacuum wavelength and $\Lambda_x$ is the full period of the lateral index modulation.

The diffraction pattern of a grid is reproduced during paraxial propagation at a particular longitudinal distance, called the Talbot length, if the wavelength is much smaller than the distance of the grid. Furthermore, the diffraction pattern is repeated at a distance of half the Talbot length but displaced laterally by half the length of the grid width.

This diffraction effect can be exploited in contact-structured lasers by introducing free-running sections, in which there is no lateral modulation of the gain or real refractive index, into the cavity. The following relationship must apply to these areas which are referred to as Talbot filter sections:

$$\frac{2(\Lambda_x)^2 n_{\mathit{eff}}}{\lambda_0} = \Lambda z, \qquad (1)$$

wherein $\Lambda_z = 2W_1$ is the full period in the propagation direction, which corresponds to the Talbot length, $W_1$ is the length of the free-running Talbot filter section, $\Lambda_x = 2W_2$ is the period in the lateral direction (see FIG. 5), $W_2$ is the lateral width of the contact-structured elements, $n_{\mathit{eff}}$ is the effective refractive index and $\lambda_0$ is the vacuum wavelength.

Lasers which exploit the Talbot effect in order to support the in-phase mode have already been presented in "P. D. V. Eijk, M. Reglat, G. Vassilieff, G. J. M. Krijnen, A. Driessen, and A. J. Mouthaan, "Analysis of the modal behavior of an antiguide diode laser array with Talbot filter", J. Light. Technol., vol. 9, no. 5, pp. 629-634, 1991". These are structured differently to the device according to the invention for generating laser radiation and include the free-running Talbot filter sections described above (see FIG. 5).

In "H. Yang, L. J. Mawst, M. Nesnidal, J. Lopez, A. Bhattacharya, and D. Botez, "10 W near-diffraction-limited peak pulsed power from Al-free phase-locked antiguided arrays", Electron. Lett., vol. 33, no. 2, pp. 136-137, 1997", a far-field angle having a full half-width of 0.62° with a power content of 60% at 10 W output powers at 15 A pulsed current has been achieved with an anti-index guided laser which utilized a Talbot filter.

Both of the indicated works deal with anti-index guided lasers. Here, the intensity maxima match the refractive index minima (see FIG. 3(d)) and the excitation of the in-phase supermode is lighter with respect to index-guided lasers due to the lateral gain distribution. However, anti-index guided lasers are distinguished by high losses and have to be grown in a comparatively elaborate manufacturing process, since two-step epitaxy is necessary here. Furthermore, during the excitation of the desired in-phase mode, as indicated above, side peaks occur at far-field angles of $\pm\varphi_0 = \lambda_0/\Lambda_x$ (see FIG. 3(f)), which restricts the power content of the central lobe.

It has been shown in "K. Staliunas, R. Herrero, and R. Vilaseca, "Subdiffraction and spatial filtering due to periodic spatial modulation of the gain-loss profile", Phys. Rev. A, vol. 80, no. 1, p. 013821, 2009" that a longitudinal-lateral gain/loss modulation in the manner of FIG. 6 results in an anisotropic gain. It has been shown in "M. Radziunas, M. Botey, R. Herrero, and K. Staliunas, "Intrinsic Beam Shaping Mechanism in Spatially Modulated Broad Area Semiconductor Amplifiers", Appl. Phys. Lett., vol. 103, no. 13, p. 132101, 2013" by simulations that this concept for amplifiers can result in a narrow far field, wherein the side peaks occurring are suppressed. To date, this concept has not been successful as an application for lasers since the out-of-phase supermode is excited by spatial hole burning so that two intensity peaks occur in the far field and the beam quality is poor (see FIG. 3g).

A semiconductor laser diode comprising a semiconductor layer sequence having an active layer is disclosed in DE 102016113071 A1, wherein the semiconductor layer sequence has a trench structure having at least one trench or a plurality of trenches on at least one side laterally next to the active area. A semiconductor component having a ribbed waveguide formed by lateral trenches is known from DE 102010040767 A1.

DISCLOSURE OF THE INVENTION

It is therefore an object of the present invention to indicate a diode laser which overcomes the aforementioned disadvantages.

These objects are achieved according to the invention by the features of the independent claim 1. Expedient configurations of the invention are set out in the respective subclaims.

According to an aspect of the present invention, the diode laser according to the invention comprises first n-conducting functional layers, an active layer which is suitable for generating electromagnetic radiation and which is arranged on the first functional layers, second p-conducting functional layers which are arranged on the active layer, a p-type contact area, wherein a Talbot filter section is formed by a longitudinal-lateral structuring of the p-type contact area in the area of an injection zone, wherein individual p-type contacts are formed by the structuring along a lateral first axis and a longitudinal second axis; and at least one facet for coupling out electromagnetic radiation along the second axis, wherein the first functional layers, the active layer and the second functional layers are stacked along a vertical third axis, wherein the first axis, the second axis and the third axis are all perpendicular to one another, wherein the longitudinal-lateral structuring comprises index-guiding trenches having a lower refractive index compared with the refractive index of the second p-conducting functional layers between the individual p-type contacts of the p-type contact area formed by the structuring.

The idea of the present invention is to reduce a beam divergence in the far field by means of a deliberate modulation of the real refractive index of the diode laser. To this end, an area of the diode laser, referred to as the injection zone, is structured with different materials having different refractive indices. The selection of the material can influence the effective refractive index at the respective longitudinal-lateral position.

The modulation of the refractive index makes it possible to excite a supermode, the field of which has the same phase (in-phase mode) under the contacts. Light, which propagates under the areas of a lower refractive index, obtains a phase shift of 7C after passing through the index-guiding trenches. Consequently, the in-phase mode is supported and the formation of the out-of-phase mode is prevented. Consequently, in contrast to conventional broad-stripe diode lasers and, in particular, stripe-geometry lasers, the laser field can, in this way, be stabilized even at high powers such that only a central beam lobe remains in the far field.

Since the charge carrier density and temperature and, consequently, the refractive index distribution depend on the operating point of the laser, even in pulsed operation at very high currents, the depth of the index-guiding trenches having a lower refractive index has to be adapted to the laser operating point. The following phase condition for the operating point must be fulfilled:

$$\Delta\varphi(x,z)=k_0\Lambda_z/2\cdot(n_0(x,z)-n_1(x,z))=\pi,$$

wherein $n_0(x, z)$ and $n_1(x, z)$ are, in each case, the real refractive index changes under the areas of the p-type contact zone and of the index-guiding trenches having a lower refractive index.

The first axis, the second axis and the third axis are all perpendicular to one another. The first axis is also preferably called the lateral axis or lateral direction. The second axis is preferably also called the longitudinal axis, longitudinal direction or propagation direction. The third axis is preferably also called the vertical axis or vertical direction.

The index-guiding trenches preferably comprise first index-guiding trenches and second index-guiding trenches, wherein the second index-guiding trenches constitute the respective outermost index-guiding trenches in the first direction. The first index-guiding trenches serve to adapt the phase of the laser radiation and the second optional index-guiding trenches stabilize the laser field.

The first n-conducting functional layers preferably comprise an n-type cladding layer and an n-type waveguide layer, more preferably the first n-conducting functional layers consist of precisely one n-type cladding layer and precisely one n-type waveguide layer. The n-type waveguide layer preferably has a thickness in the first direction of between 0.1 µm and 6 µm, even more preferably 1 µm to 3 µm. The n-type cladding layer preferably has a thickness in the first direction of between 0.1 µm and 6 µm, even more preferably 1 µm to 3 µm.

The second p-conducting functional layers preferably comprise a p-type cladding layer and a p-type waveguide layer. The p-type waveguide layer preferably has a thickness in the first direction of between 0.1 µm and 6 µm, even more preferably 0.1 µm to 2 µm. The p-type cladding layer preferably has a thickness in the first direction of between 0.1 µm and 6 µm, even more preferably 0.1 µm to 2 µm.

The longitudinal-lateral structuring preferably comprises at least 12 index-guiding trenches having a lower refractive index.

The longitudinal-lateral structuring along the first axis is preferably structured alternately with refractive indices which differ from one another.

The longitudinal-lateral structuring along the second axis is preferably structured alternately with refractive indices which differ from one another.

The alternating structuring causes the modulation of the refractive index of the diode laser. The alternating structuring consists of the index-guiding trenches having a lower refractive index and areas of the second p-conducting functional layers.

The index-guiding trenches having a lower refractive index along the third axis preferably project into the p-type cladding layer or penetrate the latter.

The index-guiding trenches having a lower refractive index along the third axis preferably project into the p-type waveguide layer.

The height of layers remaining behind up to the active zone, that is to say the depth of the index-guiding trenches having a lower refractive index, which project into the p-type waveguide layer and/or the p-type waveguide layer, determines the height of the effective refractive index difference between the structured p-type contact areas and the index-guiding trenches having a lower refractive index. It must be adapted such that light, which propagates under the areas of a lower refractive index, obtains a phase shift of $\pi$ after passing through the index-guiding trenches.

The longitudinal-lateral structuring along the first axis preferably comprises at least 6 index-guiding trenches having a lower refractive index, even more preferably at least 10. The larger the number of the index-guiding trenches along the first axis is, the lower the far-field divergence along the first axis is.

The longitudinal-lateral structuring along the second axis preferably comprises at least 2 index-guiding trenches having a lower refractive index, even more preferably at least 4. The larger the number of the index-guiding trenches along the second axis is, the better light, which propagates at higher beam angles and results in side peaks in the far field, is suppressed.

A rear facet preferably comprises a DBR section. This DBR section would have a wavelength-stabilizing effect.

The p-type contact area is preferably structured in accordance with formula 1. The half-period in the lateral direction preferably lies in the range of 3 to 10 times the vacuum wavelength, in order to guarantee lateral mono-mode operation. The half-period in the propagation direction is preferably produced in accordance with formula 1.

The various embodiments and aspects of the invention indicated in this application can be advantageously combined with one another, unless otherwise indicated in individual cases.

BRIEF DESCRIPTION OF THE DRAWINGS

The invention is explained below in exemplary embodiments with reference to the associated drawing, wherein:

FIG. 2b shows a charge carrier density distribution and phase of the forward-propagating optical field at the positions marked in FIG. 2a;

Figure 4:
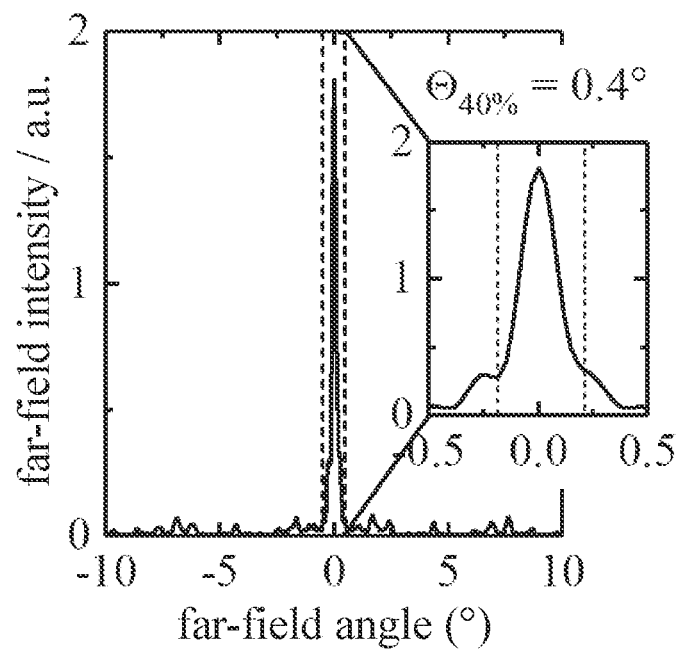
Figure 5:
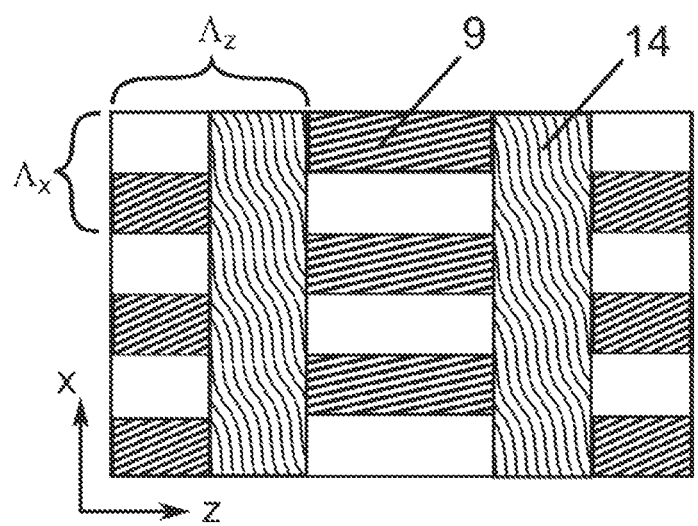
Figure 6A:
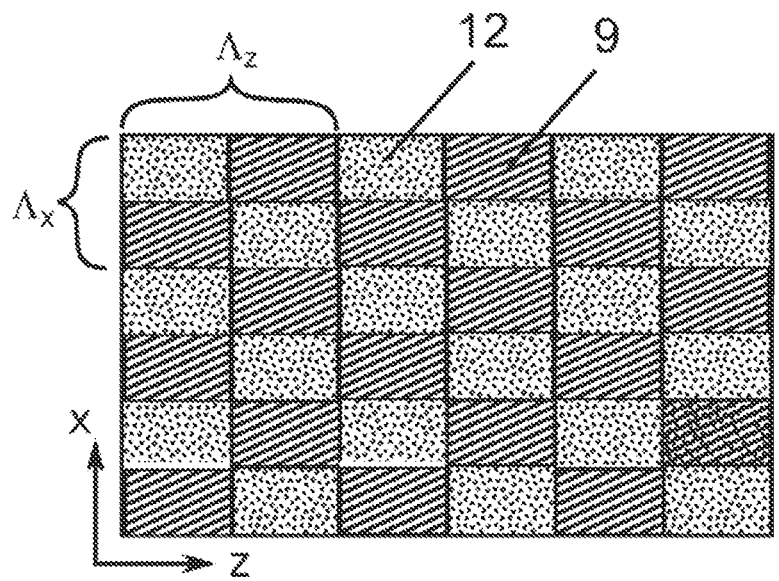
Figure 6B:
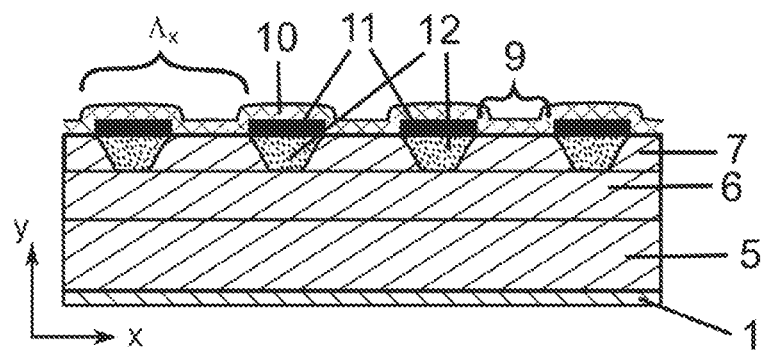

(c): shows a field amplitude (in arbitrary units) of the out-of-phase supermode during an index guiding in accordance with the refractive index variation in (a);

(d): shows a field amplitude (in arbitrary units) of the in-phase supermode during an anti-index guiding in accordance with the refractive index variation in (a);

(e): shows a field amplitude (in arbitrary units) of the out-of-phase supermode during an anti-index guiding in accordance with the refractive index variation in (a);

(f): shows a far-field intensity of an in-phase supermode of a conventional diode laser;

(g): shows a far-field intensity of an out-of-phase supermode of a conventional diode laser;

FIG. 4 shows a representation of a lateral far field of an exemplary embodiment of the diode laser according to the invention;

FIG. 5 shows a representation of the longitudinal-lateral structuring of a laser having a conventional Talbot filter section;

FIG. 6a shows a representation of a longitudinal-lateral gain/loss modulation of a conventional diode laser;

FIG. 6b shows a representation of the lateral-vertical cross-section of a gain/loss modulation of a conventional diode laser.

DETAILED DESCRIPTION OF THE DRAWINGS

Figure 1:
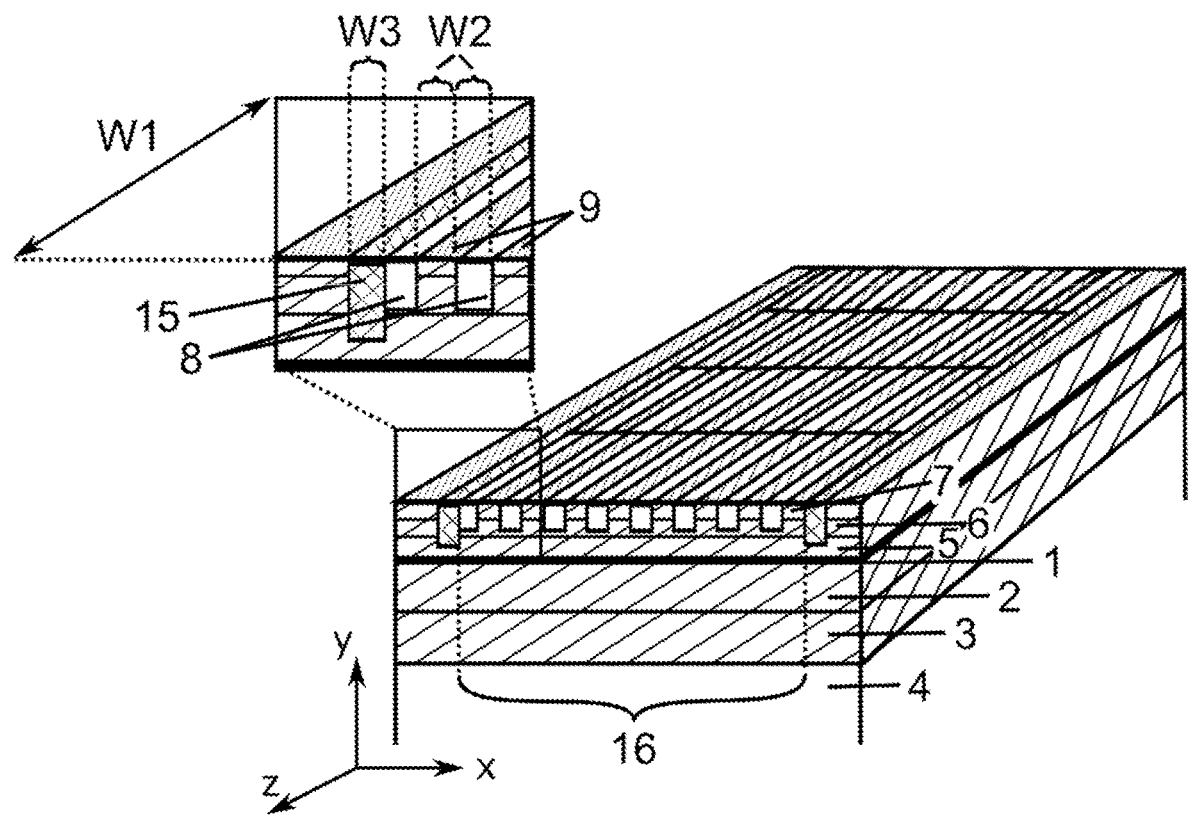
FIG. 1 shows an exemplary embodiment of the diode laser according to the invention.

FIG. 1 shows an exemplary embodiment of the diode laser according to the invention of the Talbot type having longitudinal-lateral refractive index and gain modulation. The vertical layer structure matches that of a conventional high-power laser diode. This consists of at least one active layer 1, which is surrounded by the p-type waveguide 5, p-type cladding layer 6, n-type waveguide 2 and n-type cladding layer 3, which are in turn mounted on the substrate 4. The laser is restricted by a front and rear facet. The rear facet can optionally be supplemented by a wavelength-stabilizing DBR section. The lateral injection zone 16 can optionally be restricted by second index-guiding trenches 15 which are etched through the p-type cladding layer 6 or, additionally, through parts of the p-type waveguide layer 5, and stabilize the laser field.

The p-type contact area 9 is characterized in that the layers in the vertical direction beneath this area, that is to say the p-type contact layer 7, the p-type cladding layer 6 and the p-type waveguide layer 5, are conductive. The first index-guiding trenches 8, on the other hand, do not conduct current so that a structuring of the p-type contact area results in a gain/loss modulation in the active layer 1. In order to make the structuring of the p-type contact area clear, the p-type metallization has been omitted in the representation in FIG. 1. A lateral-vertical cross section of FIG. 1, which also includes the p-type metallization, is depicted in FIG. 2c.

The p-type contact area 9 of the exemplary embodiment is structured in accordance with formula 1.

$$\frac{2(\Lambda_x)^2 n_{\textit{eff}}}{\lambda_0} = \Lambda_z \qquad (1)$$

The half-period in the lateral direction $W_2 = \Lambda_x/2$ lies at a 1 μm vacuum wavelength at 3 to 10 μm. The half-period in the propagation direction $W_1 = \Lambda_z/2$ is also produced in accordance with formula 1 and lies at a 1 μm vacuum wavelength and $n_{\textit{eff}} \approx 3.3$ at 100 μm to 2000 μm.

In addition to the longitudinal-lateral structuring of the p-type contact area 9 in the injection area 16, a longitudinal-lateral modulation of the refractive index is introduced. This modulation is created in the exemplary embodiment by first index-guiding trenches 8 having a material of a lower refractive index compared with the refractive index of the p-type waveguide layer 5 and of the p-type cladding layer 6. The number of the lateral first index-guiding trenches 8 having a width of $W_2$, which are periodically separated by a distance $W_2$ through the p-type contact area, is eight in the exemplary embodiment in FIG. 1. The number of the longitudinal first index-guiding trenches having a length of $W_1$, which are periodically separated by a distance $W_1$ through the p-type contact area, is two in the exemplary embodiment in FIG. 1.

These first index-guiding trenches 8 having a material of a lower refractive index can be generated by etching off the p-type cladding layer 6 or, additionally, by etching off parts of the p-type waveguide layer 5. Either an insulating layer 11, e.g., 100 nm SiN, is added to the etched areas, with the p-type metallization 10 thereabove, as depicted in FIG. 2c, or the etched areas are overgrown with a semiconductor material 13 which has a lower refractive index than the p-type waveguide layer 5 and p-type cladding layer 6, as represented in FIG. 2d. Since these areas are conductive, these areas of another refractive index still have to additionally be implanted so that the structuring of the p-type contact area 9 also results in a gain/loss modulation in the active zone 1. Current, which is injected into the p-type contact area 9 via the p-type metallization 10, spreads in the lateral x-direction so that the implantation should at least penetrate the p-type contact layer 7 but, better still, should additionally penetrate the p-type cladding layer.

Figure 2A:
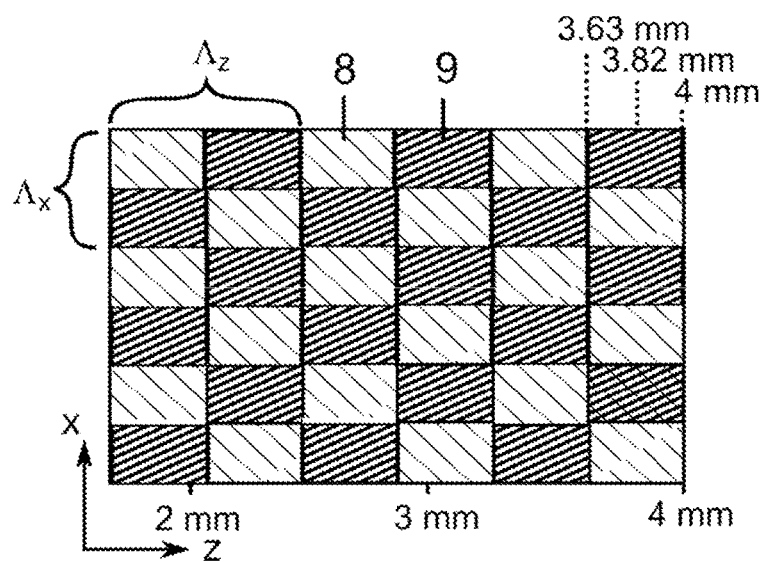
FIG. 2a shows a representation of a longitudinal-lateral structuring of a further exemplary embodiment of the diode laser according to the invention.
Figure 2B:
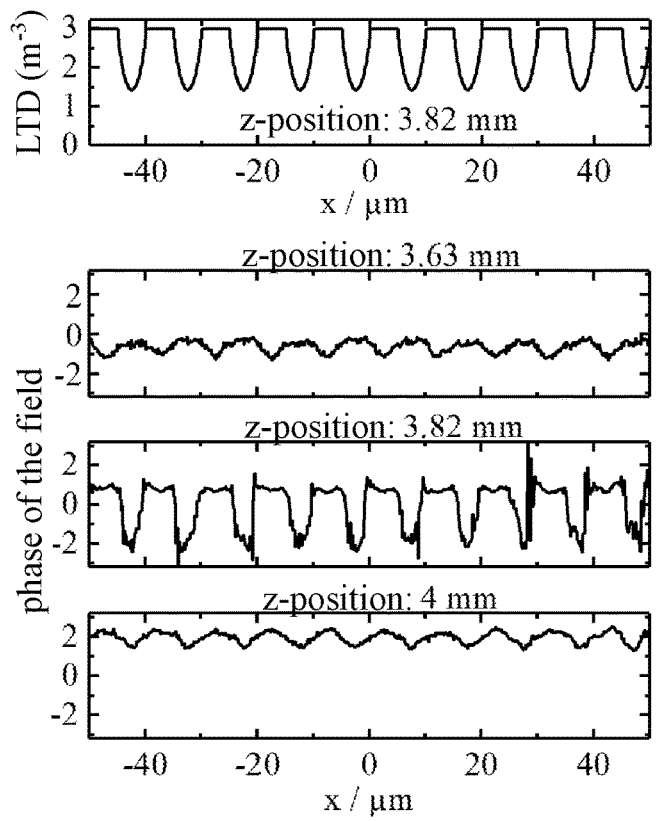
Figure 2C:
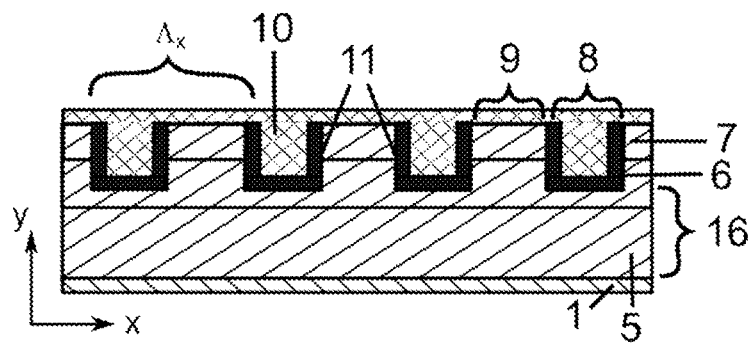
FIG. 2c shows a lateral-vertical (x,y) cross-section of the diode laser according to the invention.
Figure 2D:
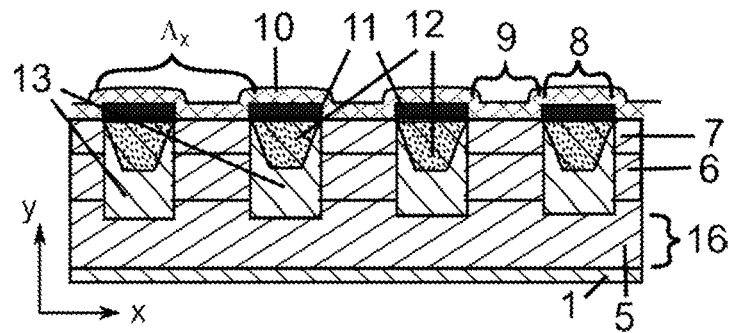
FIG. 2d shows a lateral-vertical (x, y) cross-section of a further exemplary embodiment of the diode laser according to the invention.

FIG. 2a shows a representation of a longitudinal-lateral structuring of the diode laser according to the invention which is depicted in FIG. 1. The longitudinal-lateral structuring having alternating areas of p-type contact zone 9 and first index-guiding trenches 8, which are utilized to adapt the phase, are structured in accordance with formula 1. The modulation of the refractive index by the first index-guiding trenches 8 must be selected such that the phase condition, $$\Delta\varphi(x,z) = k_0 \Lambda_z/2 \cdot (n_0(x,z) - n_1(x,z)) = \pi,$$

is met for the operating point, wherein $n_0(x, z)$ and $n_1(x, z)$ are, in each case, the real refractive index changes under the areas of the p-type contact zone 9 and of the first index-guiding trenches 8. An exemplary lateral profile of the charge carrier density (LTD) is depicted at the z-position 3.82 mm at the top of FIG. 3b. At the bottom of FIG. 3b, the phase of the forward-propagating optical field is shown at the positions marked in FIG. 2a. The regions of a low charge carrier density correspond to lateral regions of the index-guiding trenches. It can be seen that the phase of the optical field which propagates in these regions during the propagation from the z-position 3.63 mm to the z-position 4 mm obtains a phase shift of π with respect to the field which propagates in regions of high charge carrier density.

Figure 3:
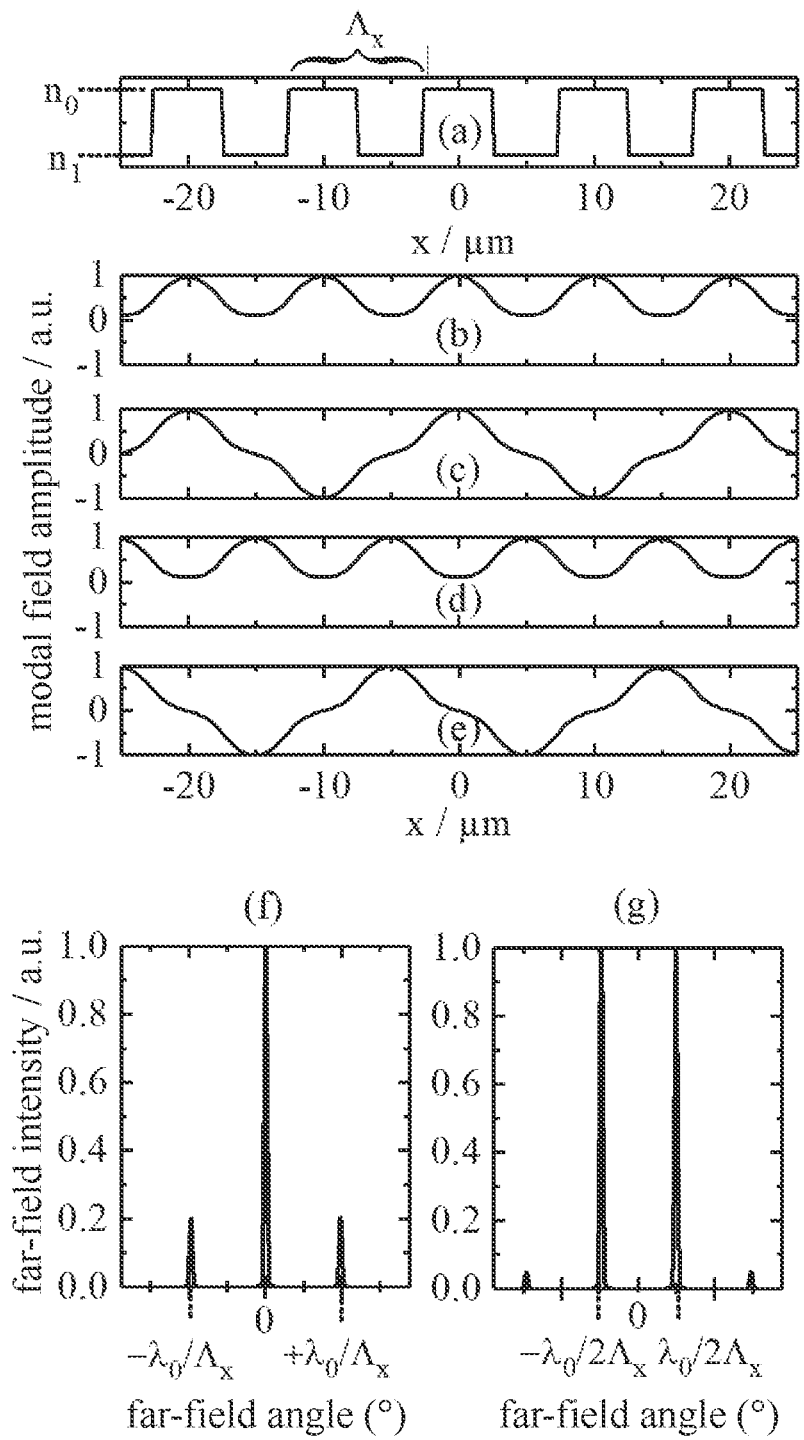
FIG. 3 shows an example of a modulation of the refractive index in conventional stripe-geometry lasers under (a); and regarding this (b): shows a field amplitude (in arbitrary units) of the in-phase supermode during an index guiding in accordance with the refractive index variation in (a)

FIGS. 2c and 2d show exemplary embodiments of the first index-guiding trenches 8. In both cases, semiconductor material of the p-type contact layer 7, the p-type cladding layer 6 and/or the p-type waveguide layer 5 is etched off. In the case of FIG. 3c, an insulating layer 11, e.g., 100 nm SiN, is introduced into the etched areas, thereabove lies the p-type metallization 10. In the case of FIG. 3d, the etched areas are overgrown with a semiconductor material 13 which has a lower refractive index than the p-type waveguide layer 5 and p-type cladding layer 6. The disadvantage of this process is that an elaborate two-step epitaxy is necessary, which is why the former method is preferred. In the latter case, the newly grown semiconductor material is conductive and, for this reason, it has to be additionally implanted 12 in these areas so that a gain/loss modulation up to the active zone is guaranteed.

An example of a modulation of the real refractive index in conventional stripe-geometry lasers is depicted in FIG. 3a. At the same time, this profile also corresponds to the modulation of the real refractive index in the laser according to the invention at a longitudinal z-position, wherein $n_0(x, z)$ and $n_1(x, z)$ are the real refractive index changes in each case under the areas of the p-type contact zone 9 and of the first index-guiding trenches 8. In FIGS. 3b to 3e, field amplitudes of noteworthy supermodes of this conventional stripe-geometry laser are depicted.

Index-guided supermodes, in which the intensity maxima, that is to say the square of the absolute value of the depicted field amplitudes, match the maxima of the real refractive index modulation, are depicted in FIGS. 3b and 3c. Anti-index-guided supermodes, in which the intensity maxima match the minima of the real refractive index modulation, are depicted in FIGS. 3d and 3e. The in-phase supermodes, in which the phase matches neighboring intensity peaks, are depicted in FIGS. 3b and 3d. The out-of-phase supermodes, in which the phase of neighboring intensity peaks shows a phase difference of π in each case, are depicted in 3c and 3e. The far field of the in-phase supermodes from FIGS. 3b and 3d is depicted in FIG. 3f. It has the desired central beam lobe, as well as side peaks at far-field angles of $+\varphi_0 \approx \lambda_0/\Lambda_x$, wherein $\lambda_0$ is the vacuum wavelength and $\Lambda_x$ is the full period of the lateral index modulation. The far field of the out-of-phase supermodes from FIGS. 3c and 3e is depicted in FIG. 3g. It shows a high divergence and has two distinct intensity peaks at $\pm\varphi \approx \lambda_0/2\Lambda_x$.

FIG. 4 shows the far-field intensity of a specific embodiment of the laser according to the invention in arbitrary units. The active layer 1 of this embodiment consists of a 12 nm-thick InGaAs quantum trench for laser light emission at a wavelength of 905 nm. The active layer is situated between 1.1 μm-thick n-type waveguide layers and 0.2 μm-thick p-type waveguide layers made of Al(0.40)Ga(0.60)As having a doping of 1E17 $cm^{-3}$, restricted in each case by 2 μm-thick n-type and p-type cladding layers made of Al(0.45)Ga(0.55)As having a doping of 1E18 $cm^{-3}$.

A central beam lobe can be clearly seen, wherein the side peaks, which can be seen in FIG. 3f, have been suppressed. The central beam lobe has a power content of 40% at a far-field angle of $\Theta_{40\%}=0.4$. In this specific exemplary embodiment, the full lateral period $\Lambda_x=6$ μm and the full longitudinal period $\Lambda_z=260$ μm. The difference in refractive index brought about by index trenches is $\Delta n_0=-5.5\cdot10^{-3}$.

The injection zone 16 has a width of 270 μm and a length of 3 mm. It is restricted laterally by second index-guiding trenches 15 which additionally stabilize the laser field. A wavelength-stabilizing DBR element having a length of 1 mm is situated on the rear facet, so that the entire laser has a length of 4 mm.

FIG. 5 shows the longitudinal-lateral structuring of a laser having a conventional Talbot filter section. It comprises structured p-type contact areas 9 which result in a gain/loss modulation. These regions can theoretically have both a higher and a lower real refractive index than the adjacent regions so that the supermode can be both index-guided and anti-index-guided. However, the publications indicated above deal with anti-index guided lasers. There are no design-specific restrictions for the length of these sections in the longitudinal z-direction. The laser additionally has conventional Talbot filter sections having a length which corresponds to half the Talbot length $\Lambda_z/2$. The sections are longitudinal-laterally unstructured and the optical field can run freely here.

A longitudinal-lateral gain/loss modulation in accordance with the prior art, without additional modulation of the real refractive index by index-guiding trenches, is shown in FIG. 6a, and the lateral-vertical cross-section of such a modulation is shown in FIG. 6b. The longitudinal-lateral zone consists of periodic sequences of p-type contact zone 9 and non-conducting implanted zones 12, wherein the full period of the lateral modulation $\Lambda_x$ and the full period of the longitudinal modulation $\Lambda_z$ comply with formula 1. To ensure that current, which is injected into the p-type contact area 9 via the p-type metallization 10, does not spread in the lateral x-direction, the implantation has to penetrate at least the p-type contact layer 7 but, better still, has to additionally penetrate the p-type cladding layer. Thus, a gain/loss modulation up to the active zone 1 can be guaranteed.

LIST OF REFERENCE NUMERALS

1 Active layer
2 n-type waveguide layer
3 n-type cladding layer
4 Carrier substrate
5 p-type waveguide layer
6 p-type cladding layer
7 p-type contact layer
8 First index-guiding trenches
9 p-type contact area
10 p-type metallization
11 Insulating layer
12 Implantation
13 Semiconductor material of a lower refractive index than the material of the p-type layers
14 Free-running Talbot filter section
15 (Optional) second index-guiding trenches
16 Injection zone
17 Residual layer thickness
W1 Half-period in the propagation direction
W2 Half-period in the lateral direction
W3 Width of the (optional) second index-guiding trenches
X First axis
Y Third axis
Z Second axis

The invention claimed is:
1. A diode laser, comprising:
first n-conducting functional layers;

an active layer which is suitable for generating electromagnetic radiation and which is arranged on the first functional layers;
second p-conducting functional layers which are arranged on the active layer;
a p-type contact area, wherein a Talbot filter section is formed by a longitudinal-lateral structuring of the p-type contact area in the area of an injection zone along a lateral first axis and a longitudinal second axis, wherein individual p-type contacts are formed by the structuring; and
at least one facet for coupling out electromagnetic radiation along the second axis, wherein the first functional layers, the active layer and the second functional layers are stacked along a vertical third axis, wherein the first axis, the second axis and the third axis are all perpendicular to one another,
wherein the longitudinal-lateral structuring comprises index-guiding trenches having a lower refractive index compared with the refractive index of the second p-conducting functional layers between the individual p-type contacts of the p-type contact area formed by the structuring.

2. The diode laser of claim 1, wherein the first n-conducting functional layers comprise an n-type cladding layer and an n-type waveguide layer.

3. The diode laser of claim 1, wherein the second p-conducting functional layers comprise a p-type waveguide layer and a p-type cladding layer.

4. The diode laser of claim 1, wherein the longitudinal-lateral structuring along the first axis is structured alternately with refractive indices which differ from one another.

5. The diode laser of claim 1, wherein the longitudinal-lateral structuring along the second axis is structured alternately with refractive indices which differ from one another.

6. The diode laser of claim 1, wherein the index-guiding trenches along the third axis project into or penetrates a p-type cladding layer.

7. The diode laser of claim 1, wherein the index-guiding trenches along the third axis project into a p-type waveguide layer.

8. The diode laser of claim 1, wherein the longitudinal-lateral structuring along the first axis comprises at least six of the index-guiding trenches.

9. The diode laser of claim 1, wherein the longitudinal-lateral structuring along the second axis comprises at least two of the index-guiding trenches.

10. The diode laser of claim 1, wherein the index-guiding trenches along the first axis comprise first index-guiding trenches and second index-guiding trenches, wherein the second index-guiding trenches along the first axis constitute the respective outermost index-guiding trenches.

11. A diode laser, comprising:
first n-conducting functional layers;
an active layer which is suitable for generating electromagnetic radiation and which is arranged on the first functional layers;
second p-conducting functional layers which are arranged on the active layer;
a p-type contact area, wherein a Talbot filter section is formed by a longitudinal-lateral structuring of the p-type contact area in the area of an injection zone along a lateral first axis and a longitudinal second axis, wherein individual p-type contacts are formed by the structuring; and
at least one facet for coupling out electromagnetic radiation along the second axis, wherein the first functional layers, the active layer and the second functional layers are stacked along a vertical third axis, wherein the first axis, the second axis and the third axis are all perpendicular to one another,
wherein the longitudinal-lateral structuring comprises index-guiding trenches having a lower refractive index compared with the refractive index of the second p-conducting functional layers between the individual p-type contacts of the p-type contact area formed by the structuring,
wherein the first n-conducting functional layers comprise an n-type cladding layer and an n-type waveguide layer,
wherein the second p-conducting functional layers comprise a p-type waveguide layer and a p-type cladding layer.

12. The diode laser of claim 11, wherein the longitudinal-lateral structuring along the first axis is structured alternately with refractive indices which differ from one another.

13. The diode laser of claim 11, wherein the longitudinal-lateral structuring along the second axis is structured alternately with refractive indices which differ from one another.

14. The diode laser of claim 11, wherein the index-guiding trenches along the third axis project into or penetrates a p-type cladding layer.

15. The diode laser of claim 14, wherein the index-guiding trenches along the third axis project into a p-type waveguide layer.

16. The diode laser of claim 11, wherein the longitudinal-lateral structuring along the first axis comprises at least six of the index-guiding trenches.

17. The diode laser of claim 11, wherein the longitudinal-lateral structuring along the second axis comprises at least two of the index-guiding trenches.

18. The diode laser of claim 11, wherein the index-guiding trenches along the first axis comprise first index-guiding trenches and second index-guiding trenches, wherein the second index-guiding trenches along the first axis constitute the respective outermost index-guiding trenches.

19. A diode laser, comprising:
first n-conducting functional layers;
an active layer which is suitable for generating electromagnetic radiation and which is arranged on the first functional layers;
second p-conducting functional layers which are arranged on the active layer;
a p-type contact area, wherein a Talbot filter section is formed by a longitudinal-lateral structuring of the p-type contact area in the area of an injection zone along a lateral first axis and a longitudinal second axis, wherein individual p-type contacts are formed by the structuring; and
at least one facet for coupling out electromagnetic radiation along the second axis, wherein the first functional layers, the active layer and the second functional layers are stacked along a vertical third axis, wherein the first axis, the second axis and the third axis are all perpendicular to one another, wherein the longitudinal-lateral structuring comprises index-guiding trenches having a lower refractive index compared with the refractive index of the second p-conducting functional layers between the individual p-type contacts of the p-type contact area formed by the structuring,
wherein the index-guiding trenches along the third axis project into or penetrates a p-type cladding layer,
wherein the index-guiding trenches along the third axis project into a p-type waveguide layer.

20. The diode laser of claim 19, wherein the index-guiding trenches along the first axis comprise first index-guiding trenches and second index-guiding trenches, wherein the second index-guiding trenches along the first axis constitute the respective outermost index-guiding trenches.

\* \* \* \* \*